(12) United States Patent
Zapata et al.

(10) Patent No.: US 12,157,217 B2
(45) Date of Patent: Dec. 3, 2024

(54) POTTING BOAT HEAT SINK

(71) Applicant: MILWAUKEE ELECTRIC TOOL CORPORATION, Brookfield, WI (US)

(72) Inventors: Mauricio Builes Zapata, Wauwatosa, WI (US); Timothy J. Bartlett, Waukesha, WI (US); Kevin A. McLachlan, Brookfield, WI (US); Andrew D. Van Hoorn, Menomonee Falls, WI (US); Daniel R. Ertl, Brookfield, WI (US); Nicholas C. Mantych, Burlington, WI (US)

(73) Assignee: Milwaukee Electric Tool Corporation, Brookfield, WI (US)

( * ) Notice: Subject to any disclaimer, the term of this patent is extended or adjusted under 35 U.S.C. 154(b) by 277 days.

(21) Appl. No.: 17/694,969

(22) Filed: Mar. 15, 2022

(65) Prior Publication Data

US 2022/0295657 A1    Sep. 15, 2022

Related U.S. Application Data

(60) Provisional application No. 63/210,094, filed on Jun. 14, 2021, provisional application No. 63/161,277, filed on Mar. 15, 2021.

(51) Int. Cl.
*B25F 5/00* (2006.01)
*B25D 17/20* (2006.01)
(Continued)

(52) U.S. Cl.
CPC .............. *B25F 5/008* (2013.01); *B25D 17/20* (2013.01); *H02K 7/145* (2013.01); *H02K 11/33* (2016.01);
(Continued)

(58) Field of Classification Search
CPC ......... B25F 5/008; B25D 17/20; B25D 11/06; H02K 7/145; H02K 2211/03; H02K 11/33;
(Continued)

(56) References Cited

U.S. PATENT DOCUMENTS

| 4,707,763 A | 11/1987 | Kudo |
| 5,060,114 A | 10/1991 | Feinberg et al. |

(Continued)

FOREIGN PATENT DOCUMENTS

| DE | 10205818 A1 | 8/2003 | |
| DE | 2007063310 | * 7/2009 | ......... H05K 7/20409 |

(Continued)

OTHER PUBLICATIONS

International Search Report and Written Opinion for Application No. PCT/US2022/020311 dated Jun. 27, 2022 (10 pages).

*Primary Examiner* — Stephen F. Gerrity
*Assistant Examiner* — Linda J Hodge
(74) *Attorney, Agent, or Firm* — Quarles & Brady LLP (57) ABSTRACT

A potting boat adapted to receive a printed circuit board is described. The boning boat includes a base plate and a plurality of sidewalls projecting from the base plate, a plurality of cooling fins, a recessed portion, and an arm. The plurality of cooling fins are formed on one of the sidewalls. The cooling fins extend laterally outward from the one of the sidewalls. The recessed portion is in a first sidewall of the plurality of sidewalls, and extends laterally inward. The arm has a first end fixed to the sidewall and an opposite, second end not connected with the first sidewall. The arm at least partially overlays the recessed portion to define a void within which electrical wires connected to the printed circuit board are retained proximate the first sidewall.

20 Claims, 6 Drawing Sheets

(51) Int. Cl.
*H02K 7/14* (2006.01)
*H02K 11/33* (2016.01)
*H05K 7/20* (2006.01)
*B25D 11/06* (2006.01)
*H05K 7/14* (2006.01)

(52) U.S. Cl.
CPC .......... *H05K 7/20409* (2013.01); *B25D 11/06* (2013.01); *B25D 2250/095* (2013.01); *H02K 2211/03* (2013.01); *H05K 7/1417* (2013.01)

(58) Field of Classification Search
CPC ...... H02K 9/227; H02K 9/22; H05K 7/20409; H05K 7/20463; H05K 7/1417; H05K 5/0247; H05K 5/064
See application file for complete search history.

(56) References Cited

U.S. PATENT DOCUMENTS

| | | | |
|---|---|---|---|
| 6,154,369 A | 11/2000 | Martinez, Jr. et al. | |
| 6,185,101 B1 | 2/2001 | Itabashi et al. | |
| 6,418,021 B1 | 7/2002 | Itabashi et al. | |
| 6,731,503 B2 | 5/2004 | Privett et al. | |
| 6,840,496 B2 | 1/2005 | Maercovich et al. | |
| 6,845,961 B2 | 1/2005 | Maercovich et al. | |
| 6,920,047 B2 | 7/2005 | Privett et al. | |
| 7,106,593 B2 | 9/2006 | Stabile et al. | |
| 7,209,360 B1 | 4/2007 | Yarza | |
| 7,417,841 B2 | 8/2008 | Hotchkiss et al. | |
| 8,092,932 B2 | 1/2012 | Phillips et al. | |
| 8,107,207 B2 | 1/2012 | Hotchkiss et al. | |
| 8,107,208 B2 | 1/2012 | Hotchkiss et al. | |
| 8,168,896 B2 | 5/2012 | Loibl et al. | |
| 8,803,452 B2 | 8/2014 | Shum et al. | |
| 8,821,778 B2 | 9/2014 | Kraus | |
| 9,154,009 B2 | 10/2015 | Alemu | |
| 9,318,932 B2 | 4/2016 | Purohit et al. | |
| 9,450,472 B2 | 9/2016 | Hatfield et al. | |
| 9,480,185 B2 | 10/2016 | Linderman | |
| 9,510,438 B2 | 11/2016 | Wakana et al. | |
| 9,674,976 B2 | 6/2017 | Strei et al. | |
| 9,812,930 B2 | 11/2017 | Purohit et al. | |
| 9,819,241 B2 | 11/2017 | Smith et al. | |
| 9,847,194 B2 | 12/2017 | Ekstrom et al. | |
| 10,043,619 B2 | 8/2018 | Ekstrom et al. | |
| 10,056,806 B2 | 8/2018 | Hatfield et al. | |
| 10,098,261 B2 | 10/2018 | Linderman | |
| 10,326,337 B2 | 6/2019 | Omura et al. | |
| 2003/0112602 A1 | 6/2003 | Lin | |
| 2006/0120054 A1 | 6/2006 | Buschke | |
| 2007/0099073 A1 | 5/2007 | White et al. | |
| 2008/0113262 A1 | 5/2008 | Phillips et al. | |
| 2009/0057006 A1 | 3/2009 | Kishibata et al. | |
| 2010/0108341 A1 | 5/2010 | Casalena et al. | |
| 2011/0008655 A1 | 1/2011 | White et al. | |
| 2012/0155028 A1 | 6/2012 | Stokes | |
| 2013/0342041 A1 | 12/2013 | Ayers et al. | |
| 2015/0280516 A1 | 10/2015 | Ekstrom et al. | |
| 2015/0282337 A1* | 10/2015 | Ekstrom | H01H 9/061 173/170 |
| 2016/0020676 A1* | 1/2016 | Omura | H02K 9/227 310/50 |
| 2018/0034346 A1 | 2/2018 | Purohit et al. | |
| 2018/0041088 A1 | 2/2018 | Smith et al. | |
| 2018/0083510 A1 | 3/2018 | Purohit et al. | |
| 2018/0084646 A1* | 3/2018 | Purohit | H05K 5/0073 |
| 2018/0184538 A1 | 6/2018 | Bayerer | |
| 2018/0294688 A1 | 10/2018 | Smith et al. | |
| 2018/0323681 A1 | 11/2018 | Hatfield et al. | |
| 2018/0352671 A1* | 12/2018 | Takasaki | H05K 7/12 |
| 2019/0044415 A1 | 2/2019 | Hatfield et al. | |
| 2019/0291260 A1 | 9/2019 | Gainacopulos et al. | |
| 2020/0274421 A1 | 8/2020 | Purohit et al. | |
| 2022/0247280 A1* | 8/2022 | Purohit | H02K 7/14 |
| 2022/0271624 A1* | 8/2022 | Wang | B25F 5/02 |

FOREIGN PATENT DOCUMENTS

| | | |
|---|---|---|
| DE | 102017202431 B3 | 7/2018 |
| WO | 2009083315 A1 | 7/2009 |
| WO | 2018053873 A1 | 3/2018 |

\* cited by examiner

POTTING BOAT HEAT SINK

CROSS-REFERENCE TO RELATED APPLICATIONS

This application claims priority to U.S. Provisional Patent Application No. 63/210,094 filed on Jun. 14, 2021, and U.S. Provisional Patent Application No. 63/161,277 filed on Mar. 15, 2021, the entire contents of which are incorporated herein by reference.

FIELD OF THE INVENTION

The present invention relates to power tools, and more particularly to power tools having potting boat heat sinks.

BACKGROUND OF THE INVENTION

Potting boats are typically used to dissipate heat from printed circuit board assemblies in power tools. Such potting boats are made of thermally conductive material to accumulate heat generated by the electrical components for subsequent discharge from the potting boat.

SUMMARY OF THE INVENTION

The invention provides, in one aspect, a potting boat adapted to receive a printed circuit board. The potting boat comprises a base plate and a plurality of walls projecting from the base plate. The potting boat further comprises a plurality of cooling fins formed on one of the sidewalls, the cooling fins extending laterally outward from the one of the sidewalls. The potting boat further comprises a recessed portion in a first sidewall of the plurality of sidewalls, extending laterally inwardly. The potting boat further comprises an arm having a first end fixed to the first sidewall and an opposite, second end not connected with the first sidewall, the arm at least partially overlying the recessed portion to define a void within which the electrical wires are connected to the printed circuit board are retained proximate the first sidewall.

The invention provides, in another independent aspect, a power tool comprising an electric motor configured to provide torque to a rotating component in the power tool when activated, a printed circuit board including a plurality of heat-generating electrical components, and a potting boat in which the printed circuit board is received. The potting boat comprises a comprises a plurality of cooling fins formed on one of the sidewalls, the cooling fins extending laterally outward from the one of the sidewalls. The potting boat further comprises a recessed portion in a first sidewall of the plurality of sidewalls, extending laterally inwardly. The potting boat further comprises an arm having a first end fixed to the first sidewall and an opposite, second end not connected with the first sidewall, the arm at least partially overlying the recessed portion to define a void within which the electrical wires are connected to the printed circuit board are retained proximate the first sidewall. The electrical wires are routed through the void and over the first sidewall to connect with the printed circuit board.

Other features and aspects of the invention will become apparent by consideration of the following detailed description and accompanying drawings.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting.

DETAILED DESCRIPTION

Figure 1:
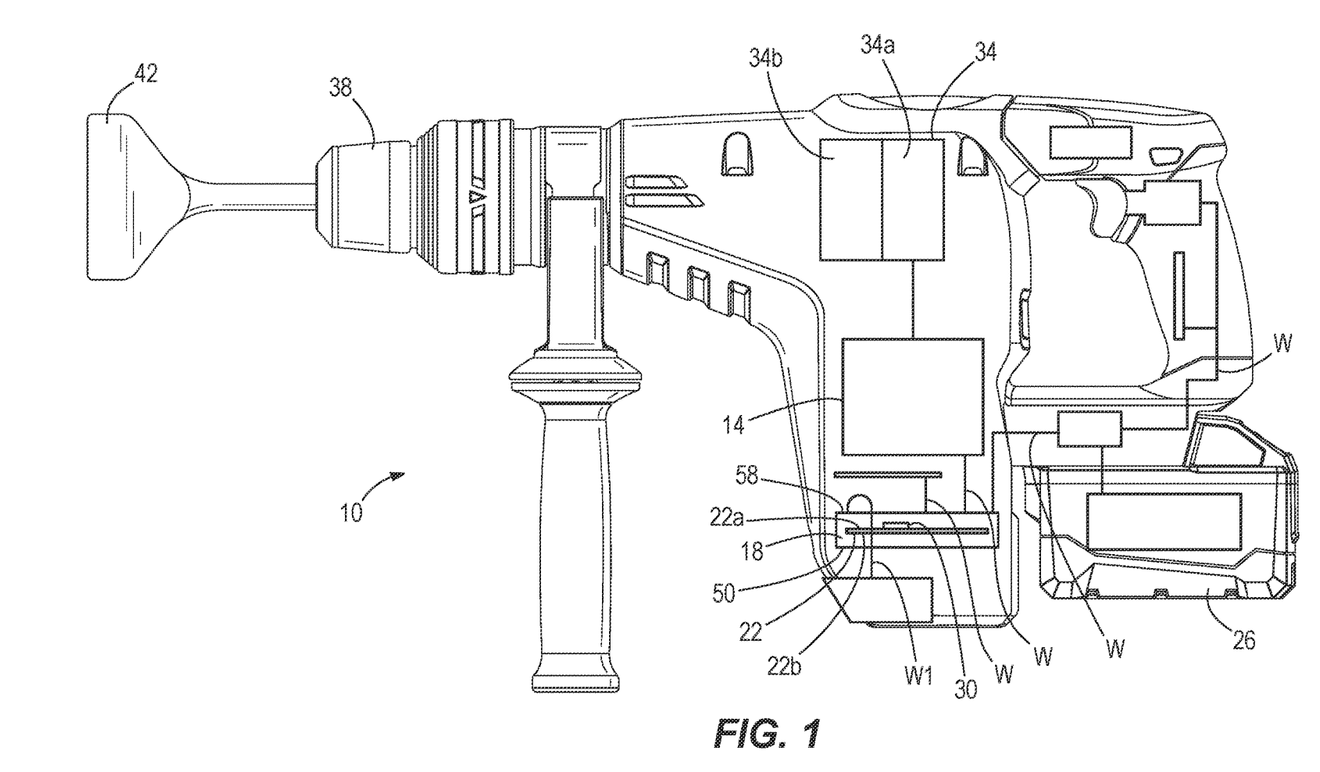
FIG. 1 is a side view of a power tool including a potting boat.

FIG. 1 schematically illustrates a power tool (e.g., a rotary hammer 10) including a brushless DC electric motor 14, a gear train 34a that receives torque from the motor 14 to rotate a spindle 38, and a reciprocating mechanism 34b operable to impact axial impacts to a tool bit (e.g., a drill bit) driven by the spindle 38. The rotary hammer 10 also includes a potting boat 18 in which a printed circuit board (i.e., PCB 22) is positioned and an onboard power source (e.g., a battery pack 26). Wires W electrically connect the motor 14, the PCB 22, and the battery pack 26. Field effect transistors (i.e., FETs 30) are mounted on the PCB 22 and are operable to function as an inverter bridge circuit to direct electrical current from the battery pack 26 to the motor 14. During use of the rotary hammer 10, the FETs 30 are rapidly and sequentially switched, which generates heat, to transmit power from the battery pack 26 to the motor 14. The potting boat 18 is configured as a heat sink to dissipate heat generated by switching of the FETs 30.

Figures 3, 4, 5, 6, 7:
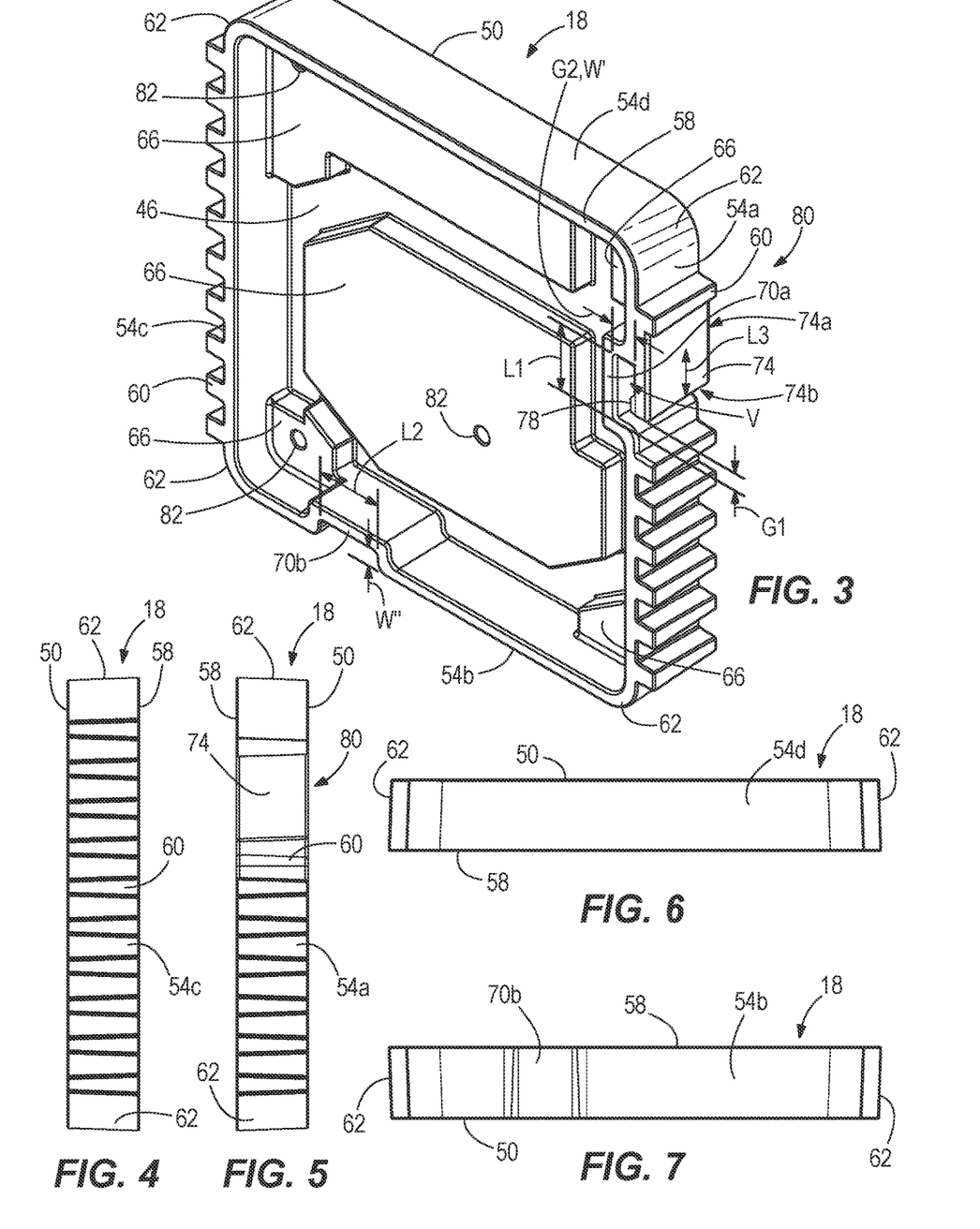
FIG. 3 is a perspective view of the potting boat of FIG. 1.
FIG. 4 is a side view of the potting boat of FIG. 3.
FIG. 5 is another side view of the potting boat of FIG. 3.
FIG. 6 is a top view of the potting boat of FIG. 3.
FIG. 7 is a bottom view of the potting boat of FIG. 3.

FIGS. 3-9 illustrate the potting boat 18 in detail. With reference to FIG. 3, the potting boat 18 includes a base plate 46, which is generally planar and defines a closed end 50 of the potting boat 18. Sidewalls 54a-54d project from the base plate 46 and terminate in an open end 58 of the potting boat 18. As such, the potting boat 18 is shaped generally as a cuboid having an open end 58. In the illustrated embodiment, there are four sidewalls 54a-54d, and each sidewall extends perpendicular from the base plate 46 to the open end 58.

As illustrated in FIG. 3, sidewall 54a and sidewall 54c are each provided with cooling fins 60 on the exterior surface thereof. In other words, the cooling fins 60 extend laterally outward from the sidewalls 54a, 54c. The sidewalls 54a, 54c are opposite from each other in the lateral direction. The cooling fins 60 extend laterally outward from the sidewalls 54a, 54c between the open end 58 and the closed end 50. In the illustrated embodiment, the cooling fins 60 axially extend the entire height of the potting boat 18 between the open end 58 and the closed end 50.

Figure 8:
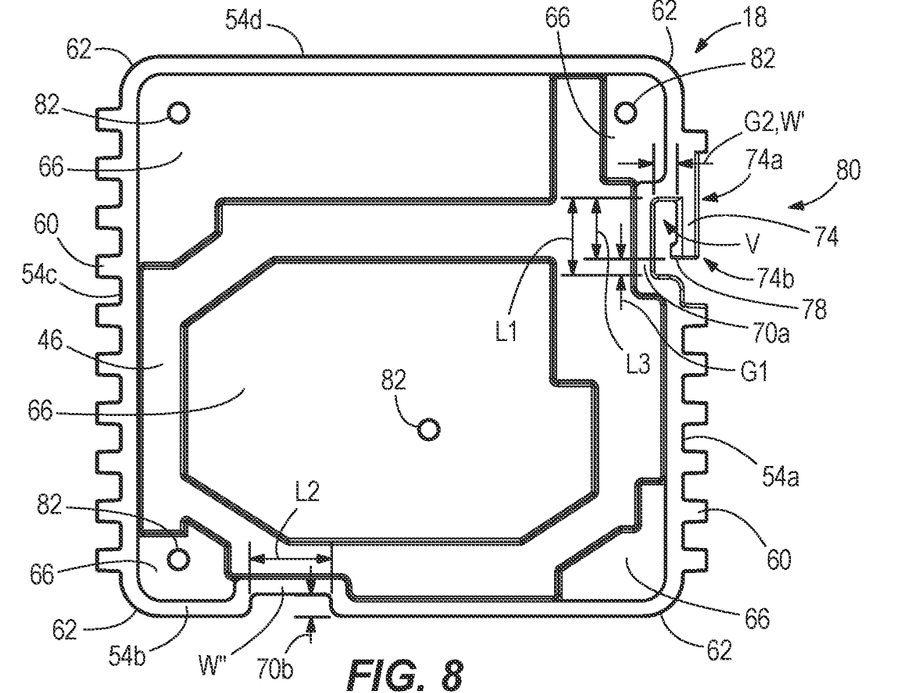
FIG. 8 is a front view of the potting boat of FIG. 3.
Figure 9:
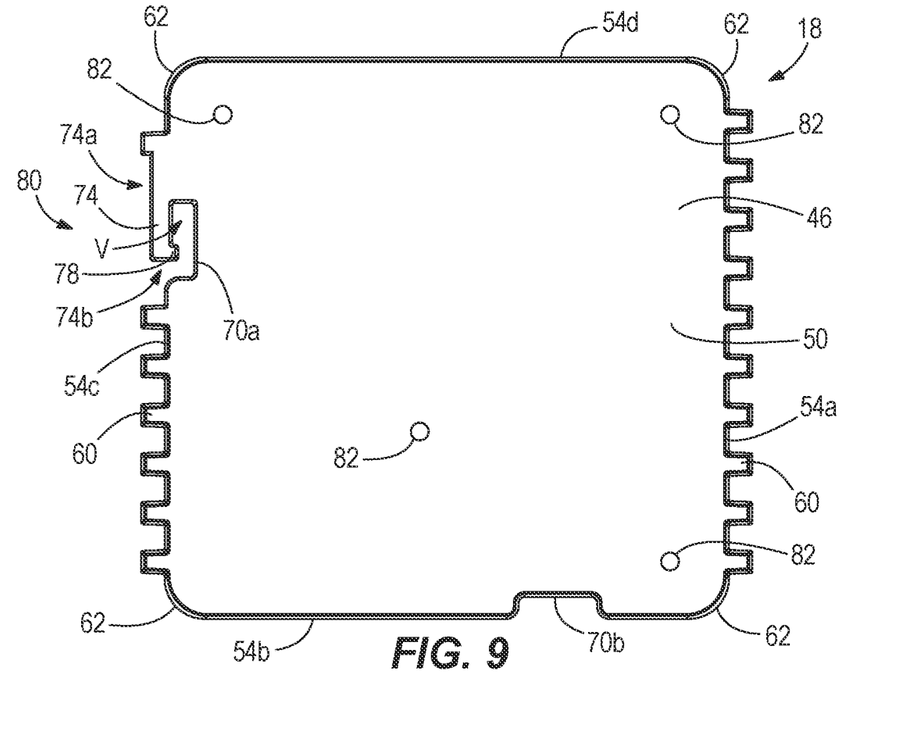
FIG. 9 is a rear view of the potting boat of FIG. 3.

As best illustrated in FIG. 8, the potting boat 18 includes rounded corners 62 between each of the sidewalls 54a-54d. The corners 62 are rounded at the interfaces between each of the sidewalls 54a-54d in a planar direction parallel with the base plate 46.

As illustrated in FIG. 3, the potting boat 18 includes an intermediate surface 66 extending from the closed end 50 to an intermediate position between the open end 58 and the closed end 50. The intermediate surface 66 is in the form of a generally planar plateau that projects from the base plate 46 towards the open end 58. In the illustrated embodiment, the plate 46 is generally planar to facilitate the flow of potting material beneath the PCB 22 in directions parallel to the planar plate 46. Other embodiments may include another void or a different height intermediate surface 66 (i.e., separate faces) projecting from the plate 46. This may further assist flow of potting material in assembly of the PCB 22 with the potting boat 18. The depth of the plate 46 is deep enough to provide enough clearance from through-hole components and/or wire solder joints to mitigate electrical shorts between the PCB 22, or any terminals or wires extending from the PCB 22 with the potting boat 18. In the illustrated embodiment, the intermediate surface 66 only extends over a portion of the base plate 46 such that a portion of the interior depth of the potting boat 18 extends from the base plate 46 to the open end 58, and another portion of the potting boat 18 extends from the intermediate surface 66 to the open end 58. The illustrated potting boat 18 includes a plurality of intermediate surfaces 66 which are separated (i.e., non-contiguous) from each other. The intermediate surfaces 66 are also generally planar such that when the PCB 22 is located within the potting boat 18, efficient thermal transfer is achieved between the PCB 22 and the potting boat 18. Finally, as illustrated in at least FIG. 3, the intermediate surfaces 66 may further include chamfered or rounded edges E to avoid wear or abrasion on the wires extending from the PCB 22 that may otherwise cause electrical shorts with the potting boat 18.

Returning to FIG. 8, the sidewalls 54a, 54b of the potting boat 18 include respective recessed portions 70a, 70b. The recessed portion 70a of the sidewall 54a extends laterally inward from the remaining length of the sidewall 54a. The recessed portion 70a spans a length L1 in a direction between the sidewall 54b and the sidewall 54d and a width W' in a direction between the sidewall 54a and the sidewall 54c. The recessed portion 70b of the sidewall 54b extends inward from the remaining length of the sidewall 54b. The recessed portion 70b spans a length L2 in a direction between the sidewall 54a and the sidewall 54c and a width W'' in a direction between the sidewall 54b and the sidewall 54c. Each of the recessed portions 70a, 70b of the potting boat 18 extend from the open end 58 to the closed end 50.

With continued reference to FIG. 8, an arm 74 (e.g., a cantilevered arm) is located adjacent the recessed portion 70a of the sidewall 54a. The arm 74 includes a first end 74a (i.e., a fixed end) connected to the sidewall 54a and a second end 74b (i.e., a free end) opposite the first end 74a. The arm 74 spans between the first end 74a and the second end 74b and has a length L3 that is less than the length L1 of the recessed portion 70a of the sidewall 54a. The length L3 of the arm 74 is measured parallel to the sidewalls 54a, 54c between the first end 74a and the second end 74b. A gap G1 extending parallel with the sidewalls 54a, 54c is defined between the second end 74b of the arm 74 and the recessed portion 70a. A gap G2 is defined between the arm 74 and the recessed portion 70a. The gap G2 extends parallel with the sidewalls 54b, 54d and opens into a void V defined by a combination of the closed end 58, the open end 50, the recessed portion 70a, and the arm 74. In some embodiments of the potting boat 14, the arm 74 has a finger 78 (FIG. 8) at the second end 74b thereof. The finger 78 projects inwardly from the second end 74b towards the recessed portion 70a and the sidewall 54c in a direction parallel with the sidewalls 54b, 54d. The gap G2 is formed as the length L3 of the arm 74 is less than a length L1 of the recessed portion 70a.

Figure 11:
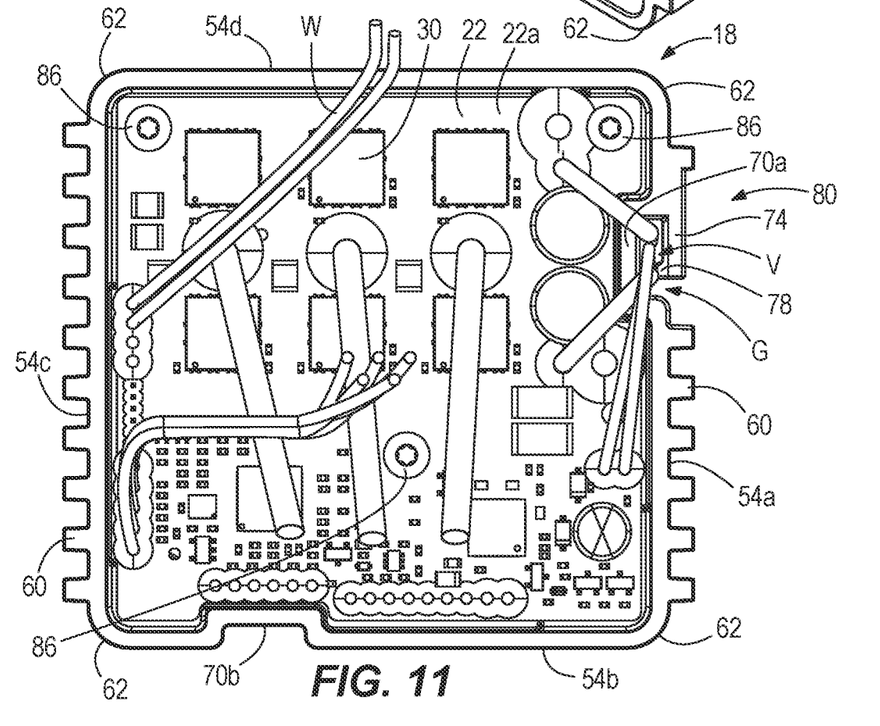
FIG. 11 is a front view of the potting boat and printed circuit board of FIG. 10.
Figure 12:
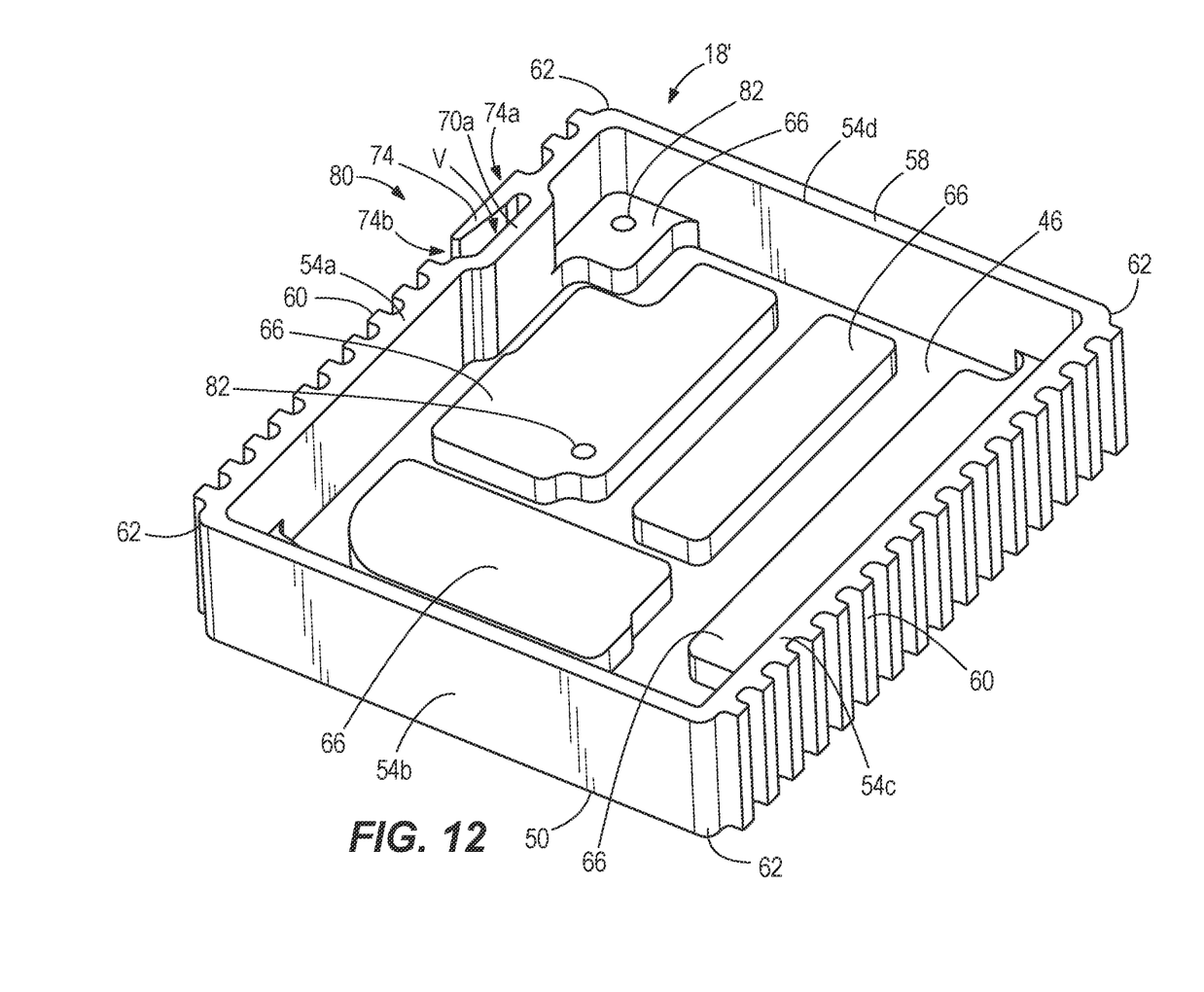
FIG. 12 is a perspective view of an alternate potting boat for use in the power tool of FIG. 1.

With continued reference to FIG. 8, the potting boat 18 includes holes 82. In the illustrated embodiment, the holes 82 extend through the entire thickness of the base plate 46 of the potting boat 18. As illustrated in FIGS. 11 and 12, the holes 82 are configured to receive fasteners 86 (e.g., screws) to secure the PCB 22 within the potting boat 18. The holes 82 are optionally located at locations corresponding with intermediate surfaces 66 of the potting boat 18. As the intermediate surfaces 66 are generally planar, when the PCB 22 is secured to the potting boat 18 via the fasteners 86, any unintended strain imparted to the PCB 22 (e.g., as a result of the PCB 22 bending from being mounted to a non-planar surface) via the fasteners 86 is mitigated. Further, other types of fasteners 86 besides screws may be employed to secure the PCB 22 to the potting boat 18. For example, other such fasteners may temporarily hold the PCB 22 against the potting boat 18 while the PCB 22 is potted and until the potting material has cured. Such temporary fasteners may provide mechanical support to the electrical components (e.g., the FETs 30) of the PCB 22 during the potting process, until the potting material has cured at which time the cured potting material itself can primarily support the electrical components. The PCB 22 includes a first surface 22a (FIGS. 2 and 10) onto which the FETs 30 are mounted. The wires W engage (i.e., are soldered or otherwise connected to) the PCB 22 at the first surface 22a thereof. The PCB 22 includes an opposite second surface 22b (FIG. 2) onto which other electrical components are mounted. The other electrical components may be nested between the intermediate surface 66 and the base plate 46. As illustrated in FIG. 1, in the illustrated embodiment, the electrical components (e.g., the FETs 30) are mounted upon the first surface 22a of the PCB 22. The first surface 22a faces the open end 58 of the potting boat 18.

Figure 2:
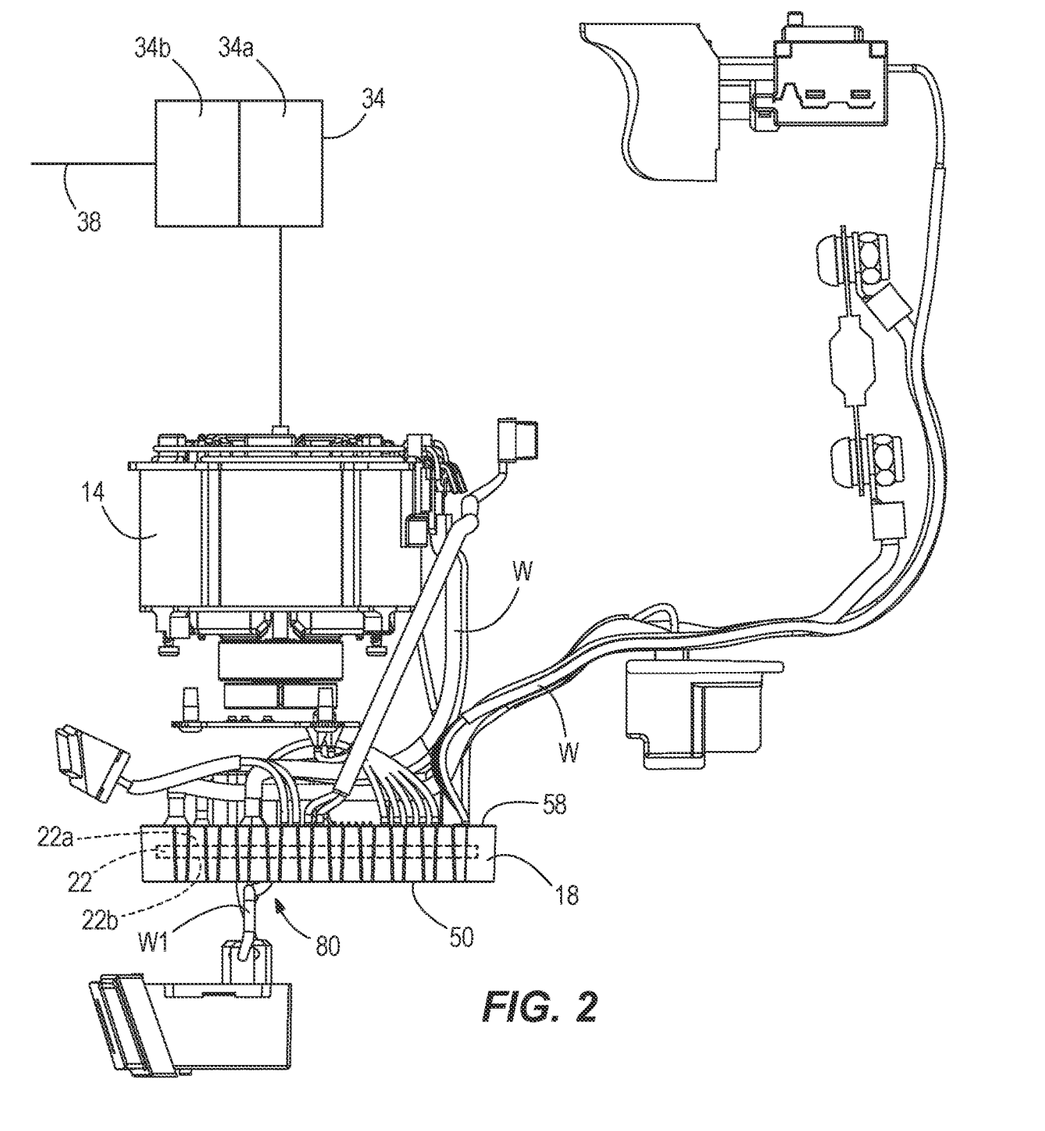
FIG. 2 is an enlarged side view of an electronics unit of the power tool of FIG. 1.
Figure 10:
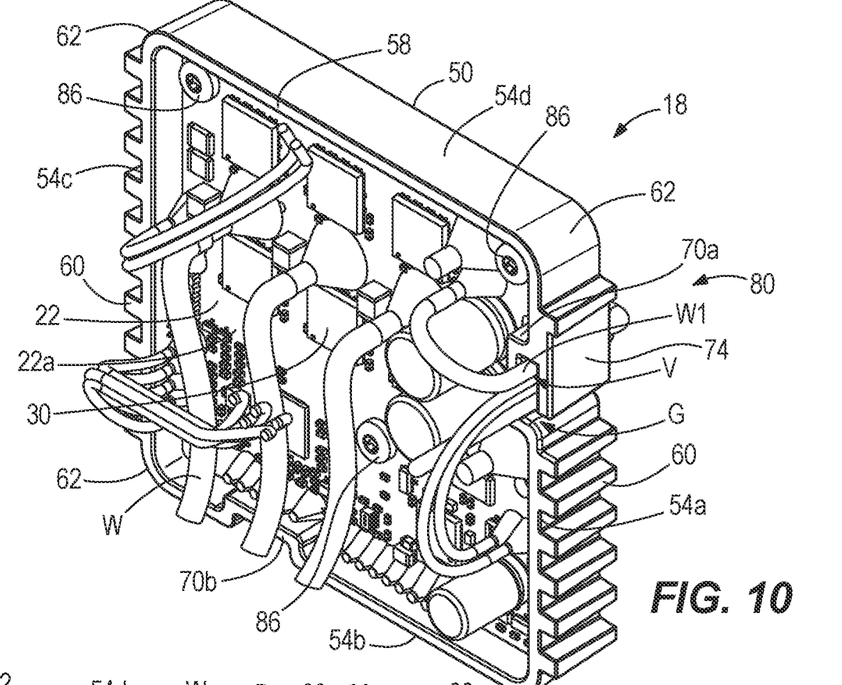
FIG. 10 is a perspective view of the potting boat of FIG. 3 with a printed circuit board mounted therein.

As best illustrated in FIGS. 2 and 10, a subset of wires W1 extends from the PCB 22, project from the open end 58 of the potting boat 18, extend through the void V, and extend beyond the closed end 50. Other wires W of the power tool 10 are connected to the PCB 22 through the open end 58 of the potting boat 18 without passing through the void V.

With continued reference to FIG. 10, a combination of the void V, the arm 74, and the finger 78 define a wire guide 80 through which the wires W1 pass and in which the wires W1 are retained. As the potting boat 18 includes the wire guide 80, separate elements (e.g., wire ties, etc.) are not required to tether the wires W1 together as they pass from the open end 58 of the potting boat 18 toward the closed end 50. In the power tool 10, the wire guide 80 provides space between the sidewall 54a and in interior surface of the outer housing 12 (FIG. 1) of the power tool 10 through which the wires W1 may be routed to connect with electrical components beneath (i.e., beyond the closed end 50 of) the potting boat 18. The arm 74 is rigid to prevent the wires W1 within the wire guide 80 from being pinched or otherwise damaged in response to an impact on the outer housing 12 of the power tool 10. In other words, the wire guide 80 nests or secures the wires W1 with the potting boat 18 as they extend from the open end 58, through the void V, and beyond the closed end 50, thereby circumventing the need for additional guide structure for the wires W1 within the power tool 10. Additionally, the recessed portion 70b also provides space between the sidewall 54b and the interior surface of the outer housing 12 of the power tool 10 through which other wires W may pass or extend through in the same manner as the wire guide 80.

The illustrated potting boat 18 is made using a die cast process. The illustrated potting boat 18 is made of aluminum, which has relatively high thermal conductivity on the order of around 200 W/m-K, or an aluminum alloy. The high thermal conductivity of the potting boat 18 increases the rate at which accumulated heat from the PCB 22 can be transferred away from the PCB 22, into the potting boat 18, and to the environment via the cooling fins 60.

FIG. 12 illustrates an alternate potting boat 18' for use with the rotary hammer 10 of FIG. 1. The potting boat 18' generally shares the same features as in the potting boat 18. However, the arm 74 in the potting boat 18' is tapered between the first end 74a and the second end 74b. In the illustrated embodiment of the potting boat 18', the taper is formed on the interior of the arm 74 such that the width of the void V increases along the length of the arm 74, from the first end 74a toward the second end 74b. The potting boat 18' does not have a finger 78 as described above with respect to the potting boat 18. Additionally, the potting boat 18' does not have the recessed portion 70b on the sidewall 54b. The potting boat 18' has the intermediate surface 66 located at different portions of the base plate 46 than the potting boat 18. The potting boat 18' also has a plurality of intermediate surfaces 66 which are separated (i.e., non-continuous) from each other. Finally, the cooling fins 60 of the potting boat 18' have a cross-sectional profile that is scalloped, as opposed to the generally rectangular cross-sectional profile of the cooling fins 60 of the potting boat 18.

Various features of the invention are set forth in the following claims.

What is claimed is:

1. A potting boat adapted to receive a printed circuit board, the potting boat comprising:
    a base plate and a plurality of sidewalls projecting from the base plate;
    a plurality of cooling fins formed on one of the sidewalls, the cooling fins extending laterally outward from one of the sidewalls;
    a recessed portion in a first sidewall of the plurality of sidewalls having a recessed wall portion extending laterally inward from a remaining length of the first sidewall; and
    an arm having a first end fixed to the first sidewall and an opposite, second end not connected with the first sidewall, the arm at least partially overlying the recessed wall portion to define a void within which electrical wires connected to the printed circuit board are retained proximate the first sidewall.

2. The potting boat of claim 1, wherein the cooling fins are formed on the first sidewall.

3. The potting boat of claim 2, further comprising a second plurality of cooling fins formed on a second sidewall of the plurality of sidewalls, wherein the second sidewall is located opposite the first sidewall.

4. The potting boat of claim 2, wherein the recessed wall portion in the first sidewall is a first recessed portion, and wherein the potting boat further comprises a second recessed portion extending laterally inward from another sidewall of the plurality of sidewalls.

5. The potting boat of claim 4, wherein the second recessed portion is located in a second sidewall that is adjacent the first sidewall, and wherein the second sidewall is devoid of cooling fins.

6. The potting boat of claim 1, wherein the arm includes an inwardly projecting finger at the second end.

7. The potting boat of claim 6, wherein a gap between the finger and the first sidewall is less than a height of the void.

8. The potting boat of claim 1, wherein the base plate defines a closed end of the potting boat and the sidewalls terminate at an open end of the potting boat, and wherein the potting boat further comprises an intermediate surface extending from the closed end to an intermediate position between the open end and the closed end.

9. The potting boat of claim 8, wherein the base plate includes holes that extend through at least a portion thereof, the holes being configured to receive fasteners to secure the printed circuit board within the potting boat, and wherein the holes extend through at least a portion of the intermediate surface.

10. The potting boat of claim 8, wherein the intermediate surface includes an edge that is at least one of chamfered or rounded.

11. The potting boat of claim 1, wherein the base plate includes holes that extend through at least a portion thereof, the holes being configured to receive fasteners to secure the printed circuit board within the potting boat.

12. The potting boat of claim 1, wherein the arm is tapered between the first end and the second end thereof.

13. The potting boat of claim 12, wherein the taper is formed on the interior of the arm such that a width of the void between the recessed wall portion and the arm increases along the length of the arm from the first end toward the second end.

14. A power tool comprising:
    an electric motor configured to provide torque to a rotating component in the power tool when activated;
    a printed circuit board including a plurality of heat-generating electrical components;
    a potting boat in which the printed circuit board is received, the potting boat including a base plate and a plurality of sidewalls projecting from the base plate;
    a plurality of cooling fins formed on one of the sidewalls, the cooling fins extending laterally outward from the one of the side walls;
    a recessed portion in a first sidewall of the plurality of sidewalls having a recessed wall portion extending laterally inward from a remaining length of the first sidewall; and
    an arm having a first end fixed to the first sidewall and an opposite, second end not connected with the first sidewall, the arm at least partially overlying the recessed wall portion to define a void within which electrical wires connected to the printed circuit board are retained proximate the first sidewall, wherein the electrical wires are routed through the void and over the first sidewall to connect with the printed circuit board.

15. The power tool of claim 14, wherein the printed circuit board includes field effect transistors operable to direct electrical current from a power source toward the motor.

16. The power tool of claim 14, wherein the cooling fins are formed on the first sidewall.

17. The power tool of claim 16, further comprising a second plurality of cooling fins formed on a second sidewall of the plurality of sidewalls, wherein the second sidewall is located opposite the first sidewall.

18. The power tool of claim 16, wherein the recessed wall portion in the first sidewall is a first recessed portion, and wherein the potting boat further comprises a second recessed portion extending laterally inward from another sidewall of the plurality of sidewalls.

19. The power tool of claim 14, wherein the arm includes an inwardly projecting finger at the second end, and wherein a gap between the finger and the first sidewall is less than a height of the void.

20. The power tool of claim 14, further comprising an outer housing within which the potting boat and the printed circuit board are received.

\* \* \* \* \*